(12) United States Patent
Cantrell et al.

(10) Patent No.: US 10,067,169 B1
(45) Date of Patent: Sep. 4, 2018

(54) METHOD AND APPARATUS TO CHARACTERIZE NONLINEAR SYSTEMS VIA THEIR STEADY STATE RESPONSE

(71) Applicants: Sean Andrew Cantrell, Williamsburg, VA (US); Sean Murdock, Glencoe, IL (US)

(72) Inventors: Sean Andrew Cantrell, Williamsburg, VA (US); Sean Murdock, Glencoe, IL (US)

( * ) Notice: Subject to any disclaimer, the term of this patent is extended or adjusted under 35 U.S.C. 154(b) by 299 days.

(21) Appl. No.: 14/961,883

(22) Filed: Dec. 7, 2015

Related U.S. Application Data

(60) Provisional application No. 62/084,032, filed on Nov. 25, 2014.

(51) Int. Cl.
  *G01R 23/20* (2006.01)
(52) U.S. Cl.
  CPC .................... *G01R 23/20* (2013.01)
(58) Field of Classification Search
  CPC ...................................... G01R 23/20
  See application file for complete search history.

(56) References Cited

U.S. PATENT DOCUMENTS

| | | | | |
|---|---|---|---|---|
| 5,952,576 A | * | 9/1999 | Schwarz | G01H 13/00 702/36 |
| 6,151,698 A | * | 11/2000 | Telichevesky | G06F 17/5036 703/13 |
| 2004/0042000 A1 | * | 3/2004 | Mehrl | G01M 11/005 356/218 |
| 2008/0022759 A1 | * | 1/2008 | Su | B82Y 35/00 73/105 |
| 2012/0157877 A1 | * | 6/2012 | Durrant | A61B 5/048 600/559 |

\* cited by examiner

*Primary Examiner* — Manuel L Barbee
(74) *Attorney, Agent, or Firm* — D'Hue Law; Cedric A. D'Hue

(57) ABSTRACT

A method for characterizing a nonlinear system using the system's steady state response including: exciting a transducer using a plurality of frequencies while decoupled from the nonlinear system, measuring the amplitude of response of each of the frequencies while decoupled from the nonlinear system, exciting the transducer using the plurality of frequencies while coupled to the nonlinear system, measuring the amplitude of response of each of the frequencies and the second harmonic of at least some of the frequencies, and solving for a set of phenomenological parameters characterizing the dynamics of the nonlinear system.

13 Claims, 3 Drawing Sheets

US 10,067,169 B1

METHOD AND APPARATUS TO CHARACTERIZE NONLINEAR SYSTEMS VIA THEIR STEADY STATE RESPONSE

FIELD OF INVENTION

The present invention relates generally to the field of metrology. More specifically, the present invention relates to characterizing the properties governing the steady state dynamics of a classical nonlinear system. This application claims priority from provisional application 62/084,032 filed Nov. 25, 2014.

BACKGROUND

Nonlinear dynamical processes and interactions influence a wide variety of physical systems of fundamental and applied significance. Nonlinear dynamical systems appear in physics, chemistry, engineering, biology, and economics, among other disciplines, representing such diverse phenomena as soliton generation in Bose-Einstein condensates, chemical oxidation processes, complex vibrations in engineering structures, biochemical processes in cell cycle initiation, traffic pattern evolution, climate changes, and social interactions. Specific examples of industrial importance include nonlinear MEMS devices of various geometries, which are widely used for applications ranging from accelerometers to stress sensors; nonlinear circuit components, which provide advantages over traditional ohmic circuits by providing enhanced sensitivity in certain applications and play a pivotal role in semiconductor devices; and atomic force microscopy, which has recently become a popular tool for characterizing the mechanical properties of materials via nonlinear interaction forces.

Measuring and assessing the parameters governing the dynamics of such generally nonlinear systems is thus of critical importance for both fundamental investigations and industrial applications. However, the nonlinearity makes characterizing the properties of these systems difficult, and no general method of measurement and assessment of dynamical nonlinear systems is known to have previously existed. The present method and apparatus disclosed herein assesses the effective dynamical properties for a large class of nonlinear systems.

SUMMARY OF THE INVENTION

The scope of the invention is defined solely by the appended claims, and is not affected to any a degree by the statements within this summary.

By way of introduction, one aspect of the invention is directed to a method for characterizing a nonlinear system using the nonlinear system's steady state response. A transducer is excited using a plurality of frequencies while decoupled from the nonlinear system and the amplitude of response of each of the frequencies while decoupled from the nonlinear system is measured. The transducer is excited using the plurality of frequencies while coupled to the nonlinear system and the amplitude of response of each of the frequencies and the second harmonic of at least some of the frequencies is measured. Logic is provided that is operable to solve for a set of phenomenological parameters characterizing the dynamics of the nonlinear system.

DETAILED DESCRIPTION OF THE PREFERRED EMBODIMENTS

Figure 1:
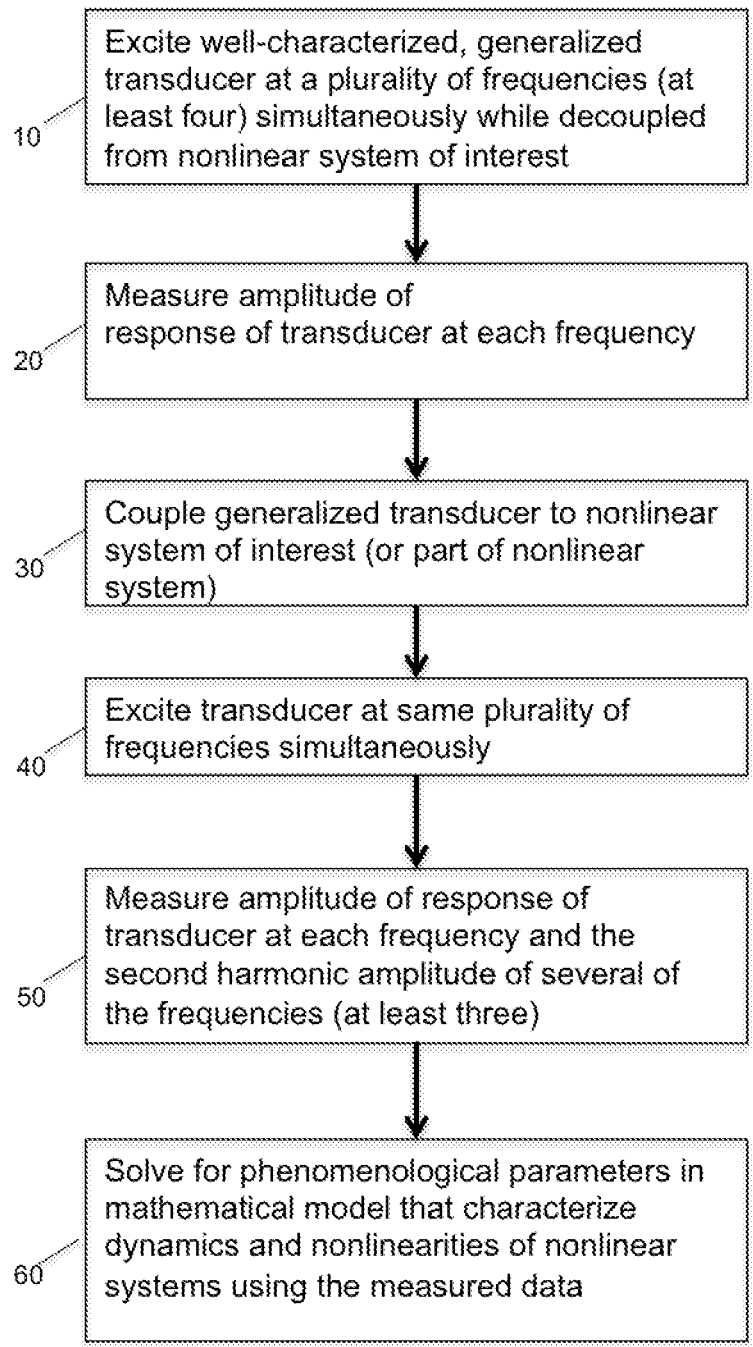
FIG. 1 illustrates a flowchart illustrating a system of the present invention according to an embodiment thereof.

The drawings have been provided as examples of the embodiments of this invention, but the general form of the invention is not limited by the depictions. The nature of the transducer depicted may be mechanical, optical, electrical, or anything capable of providing a linear response to a given stimulus; the nature of the receiver depicted may be any analogous device capable of measuring the response of the transducer to the stimulus; the nature of the probed system may be any analogous system capable of being stimulated by the transducer. Many specific embodiments and known variations thereof will be apparent to one of ordinary skill in the art.

The principals enabling the method and apparatus require a mathematical treatment of the steady state dynamics of a general class of nonlinear systems. In particular, this is necessary to determine the form of the dynamical model to fit to the data collected by the apparatus according to the element (60).

The dynamics of any classical system is governed by a set of differential equations. The steady state response (i.e. the inhomogeneous solution to the differential equations) of any linear system is given analytically by the convolution of its Green function, which is the function that determines the integral inverse of the differential operator in the equations governing its dynamics, and the generalized forcing function acting on the system. The response is given explicitly as $$\eta(t) = \int dt' g^0(t-t') F(t') \qquad (1)$$

where $\eta(t)$ is the variable describing the state of the system in configuration space, $g^0(t-t')$ is the Green function (note, the super script is not an exponent), and $F(t')$ is the generalized forcing function. The system can generally be continuously distributed in space or be comprised of multiple elements topologically. In such a case, the state variable $\eta(t)$ describes the response of the local element of the system that is subjected to a stimulus, $g^0(t-t')$ is the Green function for the local element, and $F(t')$ is the generalized forcing function acting on the local element. The relationship between the Fourier transform of the system state variable and the forcing function is important and takes the form $$\tilde{\eta}(\omega) = \tilde{g}^0(\omega) \tilde{F}(\omega) \qquad (2)$$

where $\tilde{\eta}$ and $\tilde{F}$ are the Fourier transforms of the system state variable and the generalized forcing function, respectively. $\tilde{g}^0$ is the Fourier transform of the Green function and is related to $g^0$ explicitly as:

$$g^0(t-t') = \frac{1}{2\pi} \int d\omega \tilde{g}^0(\omega) e^{i\omega(t-t')}. \quad (3)$$

The existence of any nonlinear self-interactions of the system or couplings of the system to separate systems (including the source that stimulates the system of interest in certain cases) generally alters the system Green function, and the relationship between the system state variable and the generalized forcing function takes on the functionally different form:

$$\eta(t) = \int dt' g(t,t') F(t'). \quad (4)$$

The Fourier space representation of the Green function changes as $\tilde{g}^0(\omega) \to \tilde{g}(\omega, \omega')$ such that $\tilde{\eta}(\omega) = \int d\omega' \tilde{g}(\omega,\omega') \tilde{F}(\omega')$. For nonlinearities that can be treated perturbatively, a useful ansatz for the Fourier space representation of the altered Green function takes the form:

$$\tilde{g}(\omega, \omega') = \frac{\tilde{g}^0(\omega)}{1 + \sigma \tilde{g}'^0(\omega)} \delta(\omega - \omega') + \delta \tilde{g}(\omega, \omega') \quad (5)$$

where $\sigma$ a can generally be large and depends on the self-interactions of the system and its couplings to separate systems, $\tilde{g}^0(\omega)$ is the Fourier space representation of the Green function corresponding to the remaining linear differential operator when all nonlinearities and separate system couplings are taken to be zero, and $\delta\tilde{g}(\omega,\omega')$ is an anharmonic, perturbatively small contribution to the altered Green function that depends on the self-interactions and separate system couplings. The function $\tilde{g}'^0(\omega)$ can be another Green function associated with the separate coupled system or also $\tilde{g}^0(\omega)$—the prime is simply added for generality.

In the following, the term "Green function" refers to either the standard time-space Green function or its Fourier space representation, depending on the context. The generally altered Green function is simply referred to as the Green function; $g^0$ is referred to as the linear Green function; and $$\frac{\tilde{g}^0(\omega)}{1 + \sigma' \tilde{g}^0(\omega)}$$

is referred to as the renormalized Green function.

The convolution of the Green function and the generalized forcing function gives the steady state response of any generally nonlinear system. Consequently, the behavior of any such system is completely characterized by specifying its Green function. In light of Eq. (5), it is equivalent to specify the linear Green function, the nonlinear self-coupling, and the coupling to separate systems.

The differential equations in configuration space governing the dynamics of any system that can be modeled classically can be cast into a form that has a second derivative with respect to time so that the system is dynamic, but will not have any higher orders of such derivatives, or the model will violate causality; any damping term will be first order in time and an odd derivative overall; and, if there are generalized restoring forces in the system, there will be a term that involves no derivatives with respect to time. Consequently, any such system with generalized restoring forces will generally have an associated linear Green function that can be resolved as a linear combination of damped, simple harmonic oscillator Green functions corresponding to the system's natural resonance modes whose Fourier transform can be recast in the renormalized, phenomenological form:

$$\tilde{g}^0(\omega) = \frac{1}{-m\omega^2 + k + i\gamma\omega}. \quad (6)$$

The parameters m, k, and γ given in Eq. (6) are, generally, functions of the angular frequency ω, but are typically slowly varying. Consequently, the linear Green function is determined in some frequency neighborhood of a renormalization frequency, $\omega_0$, which is also known as the renormalization scale, by simply specifying the parameters and the renormalization scale for which they are determined. The size of the neighborhood is generally dependent upon the system in question and the accuracy to which the response must be known, and may be infinite in range for some systems. Given the explicit form of the linear Green function in Eq. (6), the steady state response of any large system is thus completely determined for driving functions whose Fourier transforms have support in the appropriate frequency-space neighborhood by simply specifying the three parameters m, k, and γ, the nonlinear self-coupling, the coupling to separate systems, and the driving function itself.

For a simple mechanical system, for example, the parameters m, k, and γ may represent the local mass density, the local elastic constant, and the local damping coefficient, respectively, and the self-coupling may arise from the gradient of the elastic modulus with respect to strain; while for a simple electrical network the parameters may represent the inductance, the capacitance, and resistance of a branch of a circuit, respectively, and the couplings to separate systems may represent the change in capacitance by coupling a probe to the circuit. For more complicated systems the parameters and couplings may represent much more complex functions of the physical attributes of the system that are associated with the generalized coordinate. In such cases, a system-dependent model can be provided to relate the fundamental physical attributes of the probed system to the phenomenological parameters. For continuously distributed systems or systems with multiple topological elements, the parameters may differ between regions or elements. Thus, the parameters are generally local characteristics of a system, but may describe the global properties of single-part systems or systems that can be globally probed. It is thus clear that measuring and assessing these parameters and determining the functional form of the self-coupling completely characterizes the (element of the) system of interest and determines its dynamic behavior in the neighborhood of $\omega_0$. For systems with undesirably small valid neighborhoods about $\omega_0$, a more detailed model of the system may be provided and mapped to the measured phenomenological parameters near $\omega_0$, thereby expanding the valid neighborhood indefinitely. The focus of this invention, however, is assessing the phenomenological parameters, which provide a general method of characterization that is independent of the excess details of the probed system. The parameters and couplings can be determined by stimulating the system of interest in a known way, measuring its response, and fitting the analytical model to the obtained data.

Figure 2:
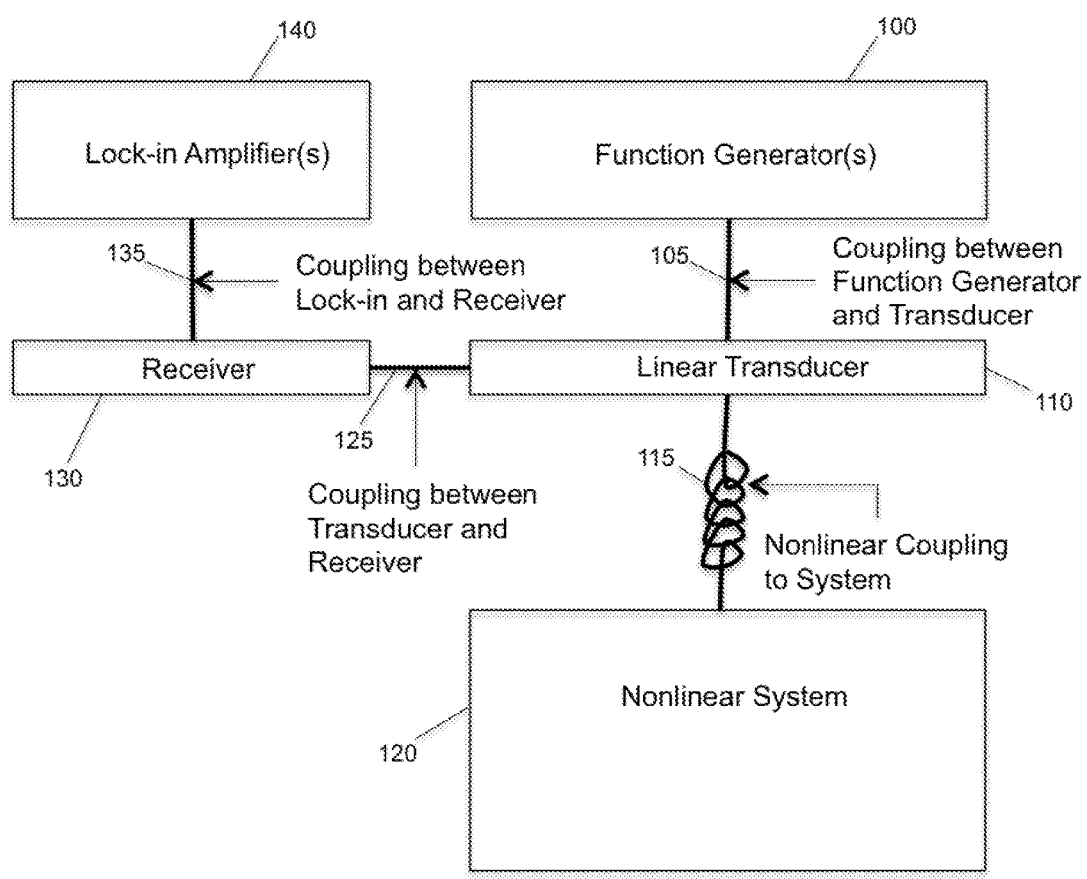
FIG. 2 illustrates the general invention schematic/topology together with the nonlinear system being probed according to one embodiment. The components are abstract and are thus not to scale or orientation and do not depict the physical embodiments of the invention. In this embodiment, the apparatus itself is comprised of elements 100, 105, 110, 125, 130, 135, and 140. It is possible for elements 100 and 140 to be combined, for elements 110 and 130 to be combined, and, therefore, elements 105 and 135 to be combined (with 125 being eliminated) depending on the function generators and lock-in amplifiers and the nature of the transducer and receiver.

With reference to the embodiment in FIG. 1 and FIG. 2 for a general nonlinear dynamical system, in order to measure and assess the parameters (60), the nonlinear system of interest (120) is coupled nonlinearly (30, 115) to a linear transducer (110) that is in turn coupled (125) to a receiver (130). The transducer is directly stimulated sinusoidally with a plurality of simultaneous frequencies (40) by a function generator or set of function generators (100), which indirectly stimulates the system of interest. The transducer's response is measured by the receiver and lock—in amplifier or set of lock—in amplifiers (50, 140) and the response of the probed system is inferred. In what follows, the terms "system of interest" and "probed system" will be used interchangeably.

The states of the transducer and probed system in configuration space are functions of time and are denoted as $\eta_1(t)$ and $\eta_2(t)$, respectively. The nonlinear coupling between the transducer and the probed system, F, is assumed to be a function of a linear combination of the instantaneous state variables for the transducer and the probed system as $F=F[c_1\eta_1(t)+c_2\eta_2(t)]$, where $c_1$ and $c_2$ determine the nature of the coupling and are treated as known. The transducer is assumed to be well-characterized with a known Green function, $g_1^0(t-t')$.

If the response of the transducer to a single sinusoidal driving stimulus at angular driving frequency $\omega$ when decoupled from the probed system is $A_f(\omega)\cos(\omega t)$ (10, 20), then its response when coupled is given by the integral equation:

$$\eta_1(t) = \int dt' g_1^0(t-t') F[c_1\eta_1(t')+c_2\eta_2(t')] + A_f \cos(\omega t). \quad (7)$$

The probed system satisfies a similar integral equation:

$$\eta_2(t) = \int dt' g_2^0(t-t') \{F[c_1\eta_1(t')+c_2\eta_2(t')] - \delta k[c_1\eta_1(t')+c_272_2(t'),\eta_2(t')]\eta_2(t')\} \quad (8)$$

where $\delta k$ is related to the deviations in the generalized, effective stiffness of the probed system ($k_2$) from its equilibrium value. The system nonlinearity and the effects of the coupling to the transducer on the phenomenological parameters in the Green function of the probed system are contained within $\delta k$. If $\delta k$ were not the coefficient of $\eta_2(t)$, then it would simply act as a driving term in the absence of nonlinearity. Therefore, the most useful general ansatz has been chosen.

To provide a more concrete form for the functions F and $\delta k$, they are expanded in polynomial series as:

$$F[c_1\eta_1(t)+c_2\eta_2(t)] = \sum_{n=0}^{\infty} F_n[c_1\eta_1(t)+c_2n_2(t)]^n \quad (9)$$

$$\delta k[c_1\eta_1(t)+c_2\eta_2(t),\eta_2(t)] = \sum_{m=0}^{\infty}\sum_{p=0}^{\infty} K_{m,p}[c_1\eta_1(t)+c_2\eta_2(t)]^m[\eta_2(t)]^p. \quad (10)$$

Specifying the coefficients $\{F_n\}$ and $\{K_{m,p}\}$ determines the functions F and $\delta k$ respectively. The higher order, nonlinear terms in the series expansion are treated as small and a perturbative approach is taken. Thus, for computational efficiency and analytical tractability, the series are truncated to n=2, m=1, and p=1. Each term is the same order in the expansion.

To determine the response of the transducer, the following ansatz is used:

$$\eta_1(t) = \sum_{l=-\infty}^{\infty} b_l e^{il\omega t} \quad (11)$$

and:

$$\psi(t) \equiv c_1\eta_1(t) + c_2\eta_2(t) = \psi_0 + \sum_{l=-\infty}^{\infty} a_l e^{il\omega t} \quad (12)$$

where $\psi_0$ is related to $F_0$ via $\varphi_0 = \int dt'[c_1 g_1^0(t-t')+c_2 g_2^0(t-t')] F_0$. The solution to Eq. (7) to order $\mathscr{O}$ ($K_{1,0}\psi\eta_2$, $K_{0,1}\eta_2^2$, $F_2\psi^2$) in terms of $b_l$ from Eq. (11)

$$b_l \approx \tilde{g}_1^0(l\omega)F_0\delta_{l,0} + \quad (13)$$
$$\frac{1}{2}A_f^2 c_1^2 \left\{ O_{2,0}(\omega)\left[1-\sigma\tilde{h}^0(-\omega)\right]^{-1}\left[1-\sigma\tilde{h}^0(\omega)\right]^{-1}\delta_{l,0} + \right.$$
$$\left. \frac{1}{2}O_{2,2}(\omega)\left[1-\sigma\tilde{h}^0\left(\frac{l}{2}\omega\right)\right]^{-2}(\delta_{l,-2}+\delta_{l,2}) \right\} +$$
$$\frac{1}{2}A_f\left[1-\sigma\tilde{h}^0(l\omega)\right]^{-1}\left[1-c_2\sigma\tilde{g}_2^{g2}(l\omega)\right](\delta_{l,-1}+\delta_{l,1}).$$

where:

$$O_{2,0}(\omega) \equiv \left\{ -\frac{1}{2}\tilde{g}_2^{g2}(l\omega)\left[\tilde{g}_2^{g2,h}(-\omega)(K_{1,0}+\sigma\tilde{g}_2^{g2}(\omega)K_{0,1}) + \tilde{g}_2^{g2,h}(\omega)(K_{1,0}+\sigma\tilde{g}_2^{g2}(-\omega)K_{0,1})\right]\sigma + \tilde{g}_1^h(l\omega)F_2 \right\} \quad (14)$$

$$O_{2,2}(\omega) \equiv \left\{ -\tilde{g}_2^{g2}(l\omega)\tilde{g}_2^{g2,h}\left(\frac{l}{2}\omega\right)\left[K_{1,0}+\sigma\tilde{g}_2^{g2}\left(\frac{l}{2}\omega\right)K_{0,1}\right]\sigma + \tilde{g}_1^h(l\omega)F_2 \right\} \quad (15)$$

$$\sigma \equiv F_1 + 2a_0 F_2 + \ldots = \frac{\partial F}{\partial \psi}\bigg|_{\psi=\psi_0+a_0} \quad (16)$$

$$\tilde{h}^0(\omega) \equiv c_1\tilde{g}_1^0(\omega) + c_2\tilde{g}_2^{g2}(\omega) \quad (17)$$

$$\tilde{g}_2^{g2}(\omega) \equiv \frac{\tilde{g}_2^0(\omega)}{1+\sigma'\tilde{g}_2^0(\omega)} \quad (18)$$

$$\sigma' \equiv [a_0 K_{1,0} + (a_0-b_0)K_{0,1}] + \ldots \quad (19)$$
$$= \frac{\partial \delta k}{\partial \psi}\bigg|_{\psi=\psi_0+a_0,\eta_2=(a_0-c_1b_0)/c_2} + \frac{\partial \delta k}{\partial \eta_2}\bigg|_{\psi=\psi_0+a_0,\eta_2=(a_0-c_1b_0)/c_2}$$

$$\tilde{g}_i^h(\omega) \equiv \frac{\tilde{g}_i^0(\omega)}{1-\sigma\tilde{h}^0(\omega)} \quad (20)$$

$$\tilde{g}_2^{g2,h}(\omega) \equiv \frac{\tilde{g}^{g2}}{1-\sigma\tilde{h}^0(\omega)} \quad (21)$$

The generalized stiffness and nonlinearity of the coupling and the static displacement (the DC-shift) that arises from the nonlinearity of the probed system when the transducer is driven act to shift the effective value of the generalized stiffness parameter in the renormalization process when dynamics are considered. The renormalized Green function for the probed system, for example, is explicitly:

$$\tilde{g}_2^{g2}(\omega) = \frac{1}{-m_2\omega^2 + (k_2 + \sigma') + i\gamma_2\omega}. \quad (22)$$

It is worth emphasizing that the solution for $I=\pm 1$ is exact when $\sigma$ and $\sigma'$ are taken to be the derivatives of the transducer-system coupling and the deviation in the generalized stiffness of the probed system, respectively.

In a typical measurement scenario, the signal is passed through a band pass filter to isolate the Ith harmonic. Under such circumstances, the measured amplitude and phase (relative to the associated free-space phase) are given by:

$$A_I = \begin{cases} 2\sqrt{b_I b_{-I}} = 2|b_{|I|}|, & I \neq 0 \\ b_0, & I = 0 \end{cases} \quad (23)$$

$$\phi_I = \tan^{-1}\left(\frac{\text{Im}(b_{|I|})}{\text{Re}(b_{|I|})}\right). \quad (24)$$

Consequently, we may write Eq. (11) using Eqs. (23) & (24) in the more conventional form:

$$\eta_1(t) = \sum_{I=0}^{\infty} A_I \cos(I\omega t + \phi_I). \quad (25)$$

The fundamental response of the transducer can be used to determine the probed system's shifted Green function by fitting the explicit relations:

$$A_1 = A_f \left| \frac{1}{1 - c_1 \sum \tilde{g}_1^0(\omega)} \right| \quad (26)$$

$$\sum^{-1} = \sigma^{-1} - c_2 \tilde{g}_2^{g2}(\omega). \quad (27)$$

to the measured amplitude (60). Since $A_f$ and $\tilde{g}_1^0$ are known from calibrating the transducer, fitting Eq. (26) to the data provides the values of $\sigma$, $m_2$, $K_2+\sigma'$, and $\gamma_2$. Once $\tilde{g}_2^{g2}(\omega)$ is known, the relation $$A_2 = A_f^2 \left| \frac{O_{2,2}(\omega)}{\left[1 - \sigma \tilde{h}^0(\omega)\right]^2} \right| \quad (28)$$

is fit to the second harmonic amplitude data to determine the nonlinear parameters of the probed system, $K_{1,0}$ and $K_{0,1}$, and interaction force, $F_2$ (60). Consequently, $k_2$ and $\sigma'$ can be separated from the measured quantity $k_2+\sigma'$. This is possible since the overall factor $$\frac{A_f^2}{\left|1 - \sigma \tilde{h}^0(\omega)\right|^2}$$

and each renormalized Green function in Eq. (28) is known from fitting Eq. (26) to the data, and the coefficients of $K_{1,0}$, $K_{0,1}$, and $F_2$ are linearly independent functions of $\omega$.

The coefficients in the truncated expansions in Eqs. (9) & (10) and the parameters in the linear Green function of the probed system constitute seven unknowns ($m_2$, $k_2$, $\gamma_2$, $\sigma$, $K_{1,0}$, $K_{0,1}$, and $F_2$), four of which pertain to the intrinsic properties of the system of interest ($m_2$, $k_2$, $\gamma_2$, and $K_{0,1}$), that must be determined to completely characterize the dynamical properties of the system of interest. Making a single set of measurements for a given angular driving frequency $\omega$ does not provide enough information to determine all of the parameters. Since there are seven unknowns, seven measurements must be made with at least four independent driving frequencies, giving four measurements for the fundamental response (thus resolving the four unknowns, $\sigma$, $m_2$, $k_2$, and $\gamma_2$, in $A_1$) and at least four for the harmonics (thus resolving the three additional unknowns, $K_{1,0}$, $K_{0,1}$, and $F_2$, in $A_2$). In principle, all of the unknowns can be uniquely determined from this set of measurements. However, inherent noise in the measurement process may require a $\chi^2$ minimizing fitting routine to fit the parameters to data using more than only four frequencies, with more frequencies reducing error. The transducer can be driven at multiple frequencies, $\{\omega_i\}=\{\omega_1, \ldots, \omega_j\}$ for $j \geq 4$, simultaneously using a function generator. Generally, the nonlinearity will generate additional signals at frequencies that are the sum and difference of all other driving frequencies. Harmonics of the difference frequencies could, in principle, alter the response of the transducer at the driving frequencies and their harmonics from what is given in Eq. (13). Furthermore, a large spread of driving frequencies could extend beyond the neighborhood of the renormalization scale. However, if the frequencies are sufficiently close together (making the driving frequencies many harmonics above the difference frequencies) or are prime numbers (meaning no harmonic of any frequency could contribute to the first harmonic response at the driving frequencies), the modification to Eq. (13) is minimal and the consistency of the phenomenological model is ensured. The dynamic contribution to $b_0$ then becomes the sum of the contributions from each frequency, $$b_0(\omega) \to \sum_{i=1}^{j} b_0(\omega_i),$$

and all other Fourier components are approximately unaltered.

Figure 3:
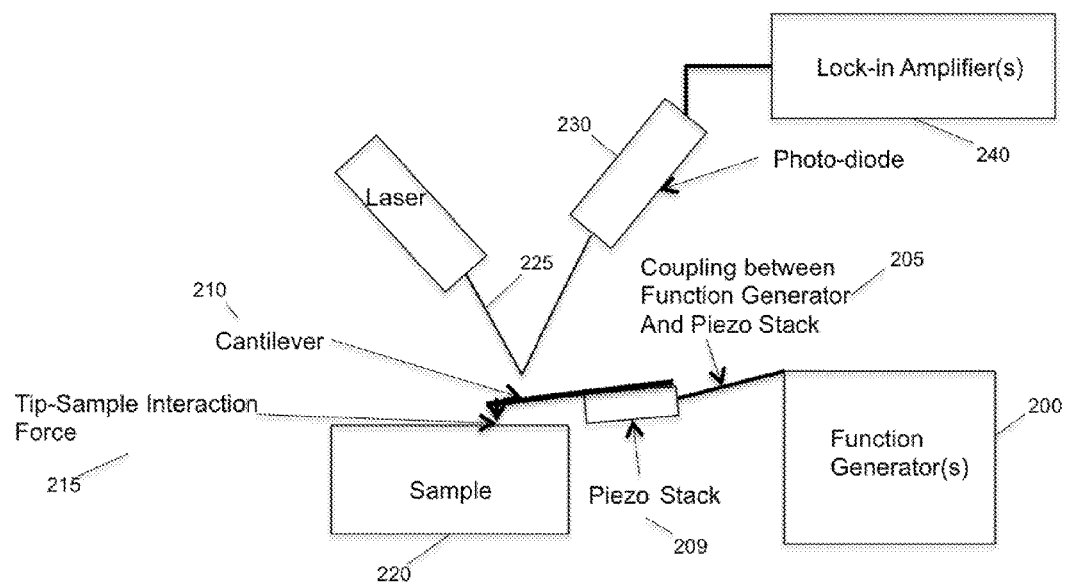
FIG. 3 illustrates the components of a typical harmonic amplitude spectrum atomic force microscope according to an embodiment of the invention. In this embodiment, there is a correspondence between the elements in FIG. 2 and FIG. 3 as: 200 and 100, 205 and 105, 209&210 together and 110, 215 and 115, 220 and 120, 225 and 125, 230 and 130, and 240 and 140.

One embodiment of this invention is the atomic force microscopy (AFM) technique known as harmonic amplitude spectrum atomic force microscopy (HAS-AFM) as illustrated in FIG. 3. In the HAS-AFM embodiment, the cantilever (210) and piezo stack (209) together serves as the linear transducer (110); the laser (225) serves as the coupling between the transducer and receiver (125); the photo-diode (230) serves as the receiver (130); the tip-sample interaction (215) serves as the nonlinear coupling between the transducer and probed system (115); the sample (220) is the probed system (120); and $c_1=c_2=1$. The technique is used to probe the sample's effective stiffness (k), mass (m), and damping parameter ($\gamma$) when sample dynamics are relevant, i.e. either for viscoelastic materials with relaxation rates comparable to the period of oscillation of the cantilever, or samples with resonance frequencies comparable to the cantilever driving frequencies. The sample is a continuously distributed system, and so these effective parameters can, in turn, be resolved in terms of the sample's (reduced) Young's modulus, bulk damping parameter(s), and, depending on Whether or not viscoelastic or resonance dynamics are being probed, its mass density. Since these properties may vary from region to region in the sample system, the AFM can spatially resolve the viscoelastic properties as it scans along the surface.

As those skilled in the art and described herein, the present invention has applications in a wide variety of nonlinear, dynamical systems.

We claim:

1. A method for characterizing a nonlinear system using the system's steady state response comprising:
   exciting a transducer using a plurality of frequencies while decoupled from the nonlinear system;
   wherein the nonlinear system is a sample, wherein the transducer is a cantilever attached to a piezo stack, and the cantilever has a tip attached to the opposite end, wherein the tip interacts with the sample, wherein exciting is performed by function generators coupled to the piezo stack,
   measuring the amplitude of response of each of the plurality of frequencies while decoupled from the nonlinear system;
   exciting the transducer using the plurality of frequencies while coupled to the nonlinear system;
   measuring the amplitude of response of each of the plurality of frequencies and the second harmonic of at least some of the plurality of frequencies while the transducer is coupled to the nonlinear system;
   wherein measuring is performed by bouncing light from a laser off the cantilever and onto a photo-diode while interacting the tip with the sample;
   determining the form of a dynamical model to fit the measured data; and
   solving for a set of phenomenological parameters characterizing the dynamics of the nonlinear system, and
   wherein the method is used in microelectromechanical applications including accelerometers, stress sensors, nonlinear circuit components, or AFM.

2. The method of claim 1, wherein the plurality of frequencies includes at least four frequencies.

3. The method of claim 1, wherein the plurality of frequencies includes at least three frequencies.

4. The method of claim 1, wherein the nonlinear system is a continuously distributed system or a system with multiple topological elements.

5. The method of claim 1 for probing a sample's effective stiffness, mass, and damping parameter, wherein relaxation rates of the response of each of the frequencies are similar to the period of oscillation of the cantilever.

6. The method of claim 1 for probing a sample's effective stiffness, mass, and damping parameter, wherein the resonance frequencies of the sample are comparable to the plurality of frequencies used to stimulate the cantilever.

7. The method of claim 1, wherein a sample's effective stiffness, mass, and damping parameter are spatially resolved in a sample as the sample surface is scanned.

8. A device for characterizing a nonlinear system using the system's steady state response, the device comprising:
   a linear transducer, a receiver, function generators, lock-in amplifiers, and logic,
   wherein the nonlinear system has a first coupling nonlinearly to a linear transducer,
   wherein the linear transducer has second coupling to the receiver,
   wherein the lock-in amplifiers have a third coupling to the receiver,
   wherein the linear transducer has a fourth coupling to the function generators,
   wherein the function generators produce a plurality of frequencies to stimulate the linear transducer, wherein the linear transducer is stimulated by a plurality of frequencies while decoupled from the nonlinear system and the receiver measures the amplitude of response of each of the plurality of frequencies while the linear transducer is decoupled from the nonlinear system, and the linear transducer is stimulated by the plurality of frequencies while coupled to the nonlinear system and the receiver measures the amplitude of response of each of the frequencies and the second harmonic of at least some of the frequencies while the linear transducer is coupled to the nonlinear system; and
   wherein the measured responses are used in a form of a dynamical model determined from the fit of the measured data to solve for a set of phenomenological parameters characterizing the dynamics of the nonlinear system.

9. The device of claim 8 for harmonic amplitude spectrum AFM, further comprising a photo-diode, laser, cantilever, piezo stack, tip, and sample,
   wherein the nonlinear system is the sample,
   wherein the linear transducer is the cantilever attached to the piezo stack,
   wherein the tip is attached to the cantilever on the end opposite from the piezo stack,
   wherein the receiver is the photo-diode,
   wherein the first coupling is the tip-sample interaction, and
   wherein the second coupling is the laser.

10. The device of claim 8, wherein the device is comprised of microelectromechanical (MEMS) components.

11. The device of claim 10, wherein the device is used in applications including accelerometers, stress sensors, nonlinear circuit components, or AFM.

12. The device of claim 8, wherein at least four frequencies are used to stimulate the transceiver.

13. The device of claim 8, wherein at least three frequencies are used to measure the response.

* * * * *